US012756025B2

(12) United States Patent
Yamamoto

(10) Patent No.: US 12,756,025 B2
(45) Date of Patent: Oct. 6, 2026

(54) STATE DETERMINATION DEVICE FOR LITHIUM-ION RECHARGEABLE BATTERY

(71) Applicant: TOYOTA BATTERY CO, LTD., Kosai (JP)

(72) Inventor: Erika Yamamoto, Hamamatsu (JP)

(73) Assignee: TOYOTA BATTERY CO., LTD., Kosai (JP)

( * ) Notice: Subject to any disclaimer, the term of this patent is extended or adjusted under 35 U.S.C. 154(b) by 536 days.

(21) Appl. No.: 18/512,922

(22) Filed: Nov. 17, 2023

(65) Prior Publication Data

US 2024/0170745 A1 May 23, 2024

(30) Foreign Application Priority Data

Nov. 22, 2022 (JP) ................................ 2022-186456

(51) Int. Cl.
*H01M 10/48* (2006.01)
*H01M 10/0525* (2010.01)
(Continued)

(52) U.S. Cl.
CPC ....... *H01M 10/48* (2013.01); *H01M 10/0525* (2013.01); *H01M 10/482* (2013.01);
(Continued)

(58) Field of Classification Search
CPC ............. H01M 10/0525; H01M 10/48; H01M 10/482; H01M 10/486; H01M 4/04; H01M 4/364; H01M 4/48; H01M 4/62; H02J 7/00; G01R 31/367; G01R 31/3842; G01R 31/387; G06F 17/10
See application file for complete search history.

(56) References Cited

U.S. PATENT DOCUMENTS

2008/0254362 A1* 10/2008 Raffaelle ................ B82Y 30/00 429/188
2013/0057291 A1* 3/2013 Takahashi ............ G01R 31/389 324/427

(Continued)

FOREIGN PATENT DOCUMENTS

CA 11383647 A * 6/2020
JP 2019-114475 A 7/2019

*Primary Examiner* — Van T Trieu
(74) *Attorney, Agent, or Firm* — Maschoff Brennan

(57) ABSTRACT

A state determination device for a lithium-ion rechargeable battery includes a storage device and an execution device. The storage device stores deposition determination mapping data for defining a deposition determination mapping that uses a difference variable as an input variable and outputs information on whether lithium is deposited on a negative electrode of the lithium-ion rechargeable battery. The difference variable indicate information on a difference between a surface concentration of the negative electrode active material and an average concentration of the negative electrode active material in the lithium-ion rechargeable battery. The execution device is configured to execute a determination acquisition process for acquiring a value of the input variable of the deposition determination mapping, and a determination process for determining deposition of lithium by inputting the value of the input variable of the deposition determination mapping to the deposition determination mapping.

9 Claims, 6 Drawing Sheets

(51) Int. Cl.
*G01R 31/367* (2019.01)
*G01R 31/3842* (2019.01)

(52) U.S. Cl.
CPC ......... *H01M 10/486* (2013.01); *G01R 31/367* (2019.01); *G01R 31/3842* (2019.01); *H01M 2220/20* (2013.01)

(56) References Cited

U.S. PATENT DOCUMENTS

| | | | | |
|---|---|---|---|---|
| 2019/0198941 | A1 | 6/2019 | Oniki et al. | |
| 2022/0069370 | A1 | 3/2022 | Oniki et al. | |
| 2023/0121670 | A1* | 4/2023 | Hu ...................... | C23C 14/3414 429/231.3 |
| 2023/0132268 | A1* | 4/2023 | Xie ....................... | H01M 4/364 429/231.95 |

* cited by examiner

STATE DETERMINATION DEVICE FOR LITHIUM-ION RECHARGEABLE BATTERY

BACKGROUND

1. Field

The present disclosure relates to a state determination device for a lithium-ion rechargeable battery.

2. Description of Related Art

Japanese Laid-Open Patent Publication No. 2019-114475 describes a controller that limits the charge current of a lithium-ion rechargeable battery in order to reduce the deposition of lithium, or lithium plating, in the lithium-ion rechargeable battery.

When limiting the charge current, a variable of the lithium-ion rechargeable battery, such as current, charge rate, and temperature, is used to determine whether lithium plating is occurring. Then, an upper limit of the charge current is determined in advance in accordance with the value of the variable.

SUMMARY

When charging the lithium-ion rechargeable battery with a large current, the concentration of lithium at the surface of the negative electrode active material will initially tend to differ greatly from the average lithium concentration of the negative electrode material.

The inventor has found that the occurrence of lithium deposition depends on the difference between the average concentration and surface concentration even if the current, the charge rate, the temperature, and the like of the lithium-ion rechargeable battery are the same.

Examples of the present disclosure will now be described.

Example 1) A state determination device for a lithium-ion rechargeable battery including a storage device and an execution device. The storage device stores deposition determination mapping data. The deposition determination mapping data is data for defining a deposition determination mapping. The deposition determination mapping is mapping that uses a difference variable as an input variable and outputs information on whether lithium is deposited on a negative electrode of the lithium-ion rechargeable battery. The difference variable is a variable indicating information on a difference between a surface concentration of the negative electrode active material and an average concentration of the negative electrode active material in the lithium-ion rechargeable battery. The execution device is configured to execute a determination acquisition process and a determination process. The determination acquisition process is a process for acquiring a value of the input variable of the deposition determination mapping. The determination process is a process for determining deposition of lithium by inputting the value of the input variable of the deposition determination mapping to the deposition determination mapping.

In the above configuration, the occurrence of lithium deposition is determined using the value of the difference variable indicating the difference between the surface concentration and the average concentration of the negative electrode active material in the lithium-ion rechargeable battery as an input. Even if the current, the temperature, the charge rate, and the like of the lithium-ion rechargeable battery are the same, the result of whether lithium will be deposited differs depending on the value of the difference variable. Therefore, in the above configuration, the occurrence of lithium deposition is determined more accurately than when not referring to the value of the difference variable.

Example 2) In the state determination device according to example 1, the input variable of the deposition determination mapping includes at least one of a current of the lithium-ion rechargeable battery, a voltage of the lithium-ion rechargeable battery, a charge rate of the lithium-ion rechargeable battery, and a temperature of the lithium-ion rechargeable battery.

In the above configuration, the occurrence of lithium deposition is determined from information on the lithium-ion rechargeable battery that is more detailed than when all of the four variables are not included in the input variable.

Example 3) In the state determination device according to example 1 or 2, the lithium-ion rechargeable battery is a rechargeable battery charged by electric power generated by a motor generator of a vehicle. The execution device is configured to execute a charge time setting process. The charge time setting process is a process for setting a value of a charge time variable in accordance with a traveling state of the vehicle. The charge time variable is a variable indicating a charge time of the lithium-ion rechargeable battery. The input variable of the deposition determination mapping includes the charge time variable.

The deposition of lithium depends on the charge time. The charge time varies in accordance with the traveling state of the vehicle. Therefore, in the above configuration, the value of the charge time variable, which is set in accordance with the traveling state of the vehicle, is included in the input variable of the deposition determination mapping. This allows for the determination of lithium deposition to take into consideration the traveling state of the vehicle.

Example 4) In the state determination device according to any one of examples 1 to 3, the storage device stores difference variable output mapping data. The difference variable output mapping data is data for defining a difference variable output mapping. The difference variable output mapping is mapping using a current of the lithium-ion rechargeable battery as an input variable to output a value of the difference variable. The execution device is configured to execute a difference variable calculation acquisition process and a difference variable calculation process. The acquisition process for difference variable calculation is a process for acquiring the value of the input variable of the difference variable output mapping. The difference variable calculation process is a process for calculating the value of the difference variable by inputting the value of the input variable of the difference variable output mapping to the difference variable output mapping.

In the above configuration, the value of the difference variable is acquired by using the difference variable output mapping.

Example 5) In the state determination device according to example 4, the input variable of the difference variable output mapping includes temperature of the lithium-ion rechargeable battery.

The average concentration and the surface concentration of the negative electrode active material depend not only on the charge current of the lithium-ion rechargeable battery but also on the temperature of the lithium-ion rechargeable battery. Therefore, in the above configuration, by including the temperature of the lithium-ion rechargeable battery in the input variable of the difference variable output mapping, the value of the difference variable is calculated more accurately than when the temperature of the lithium-ion rechargeable battery is not included.

Example 6) In the state determination device according to example 4 or 5, the input variable of the deposition determination mapping includes the surface concentration. The difference variable output mapping includes an average concentration output mapping and a surface concentration output mapping. The input variable of the difference variable output mapping includes an input variable of the average concentration output mapping and an input variable of the surface concentration output mapping. The average concentration output mapping is mapping using a value of the input variable of the average concentration output mapping as an input to output the average concentration. The surface concentration output mapping is mapping using a value of the input variable of the surface concentration output mapping as an input to output the surface concentration. The difference variable calculation process includes a process for calculating the average concentration by inputting the value of the input variable of the average concentration output mapping to the average concentration output mapping, and a process of calculating the surface concentration by inputting the value of the input variable of the surface concentration output mapping to the surface concentration output mapping.

In the above configuration, the value of the difference variable is acquired from the average concentration output by the average concentration output mapping and the surface concentration output by the surface concentration output mapping. In the above configuration, the surface concentration output by the surface concentration output mapping is used as the input variable of the deposition determination mapping.

Example 7) In the state determination device according to any one of examples 1 to 6, the execution device is configured to execute a search process and an upper limit value setting process. The determination acquisition process includes a process for acquiring values of a plurality of the difference variables under an assumption that a charge current of the lithium-ion rechargeable battery will take various values. The search process is a process for searching for a maximum value of the charge current at which deposition of the lithium will not occur based on whether lithium deposition will occur that is determined in the determination process from the values of the plurality of difference variables acquired through the determination acquisition process. The upper limit value setting process is a process for setting a upper limit value for limiting charging power of the lithium-ion rechargeable battery to a lower side based on a maximum value of the charge current.

In the above configuration, the maximum value of the charge current at which lithium deposition will not occur is searched for based on whether lithium deposition will occur that is determined from the values of the difference variables acquired under the assumption that the charge current will take various values. The determination of whether lithium deposition will occur is based on the value of the difference variable. Therefore, the maximum value is more accurate than when the maximum value is searched for without considering the difference variable. Further, by setting the upper limit value in accordance with the maximum value, the margin for setting of the upper limit value is smaller than when the upper limit value is set without considering the difference variable.

Example 8) In the state determination device according to example 7, the execution device includes an initial value setting process. The initial value setting process is a process for setting an initial value related to a candidate for a maximum value of the charge current in accordance with the maximum value searched for by the search process in the past. The search process includes a process for determining a relative magnitude between the initial value and the charge current that is the candidate for the maximum value in accordance with a determination result of the determination process using the initial value.

The maximum value of the current charge current may be close to the past maximum value. Therefore, in the above configuration, the current maximum value can be searched for efficiently by setting the past maximum value as the initial value of the search process.

Example 9) In the state determination device according to example 1, the lithium-ion rechargeable battery is a battery pack of series-connected battery cells. The execution device is configured to execute a selection process. The selection process is a process for selecting from the battery cells one having a high probability of lithium deposition occurring based on temperature of each of the battery cells. The determination process is a process for determining whether lithium deposition is occurring in the battery cell selected by the selection process.

The ease of lithium deposition varies depending on the temperature of the battery cell. Therefore, in the above configuration, a battery cell having a high probability of lithium deposition occurring is selected based on the temperature of the battery cell. Then, the occurrence of lithium deposition is determined for the selected battery cell. This allows for the occurrence of lithium deposition in the battery pack to be determined more efficiently than when determining the occurrence of lithium deposition for each of the battery cells.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

This description provides a comprehensive understanding of the methods, apparatuses, and/or systems described. Modifications and equivalents of the methods, apparatuses, and/or systems described are apparent to one of ordinary skill in the art. Sequences of operations are exemplary, and may be changed as apparent to one of ordinary skill in the art, with the exception of operations necessarily occurring in a certain order. Descriptions of functions and constructions that are well known to one of ordinary skill in the art may be omitted.

Exemplary embodiments may have different forms, and are not limited to the examples described. However, the examples described are thorough and complete, and convey the full scope of the disclosure to one of ordinary skill in the art.

In this specification, "at least one of A and B" should be understood to mean "only A, only B, or both A and B."

First Embodiment

A first embodiment will now be described with reference to the drawings.

Configuration

Figure 1:
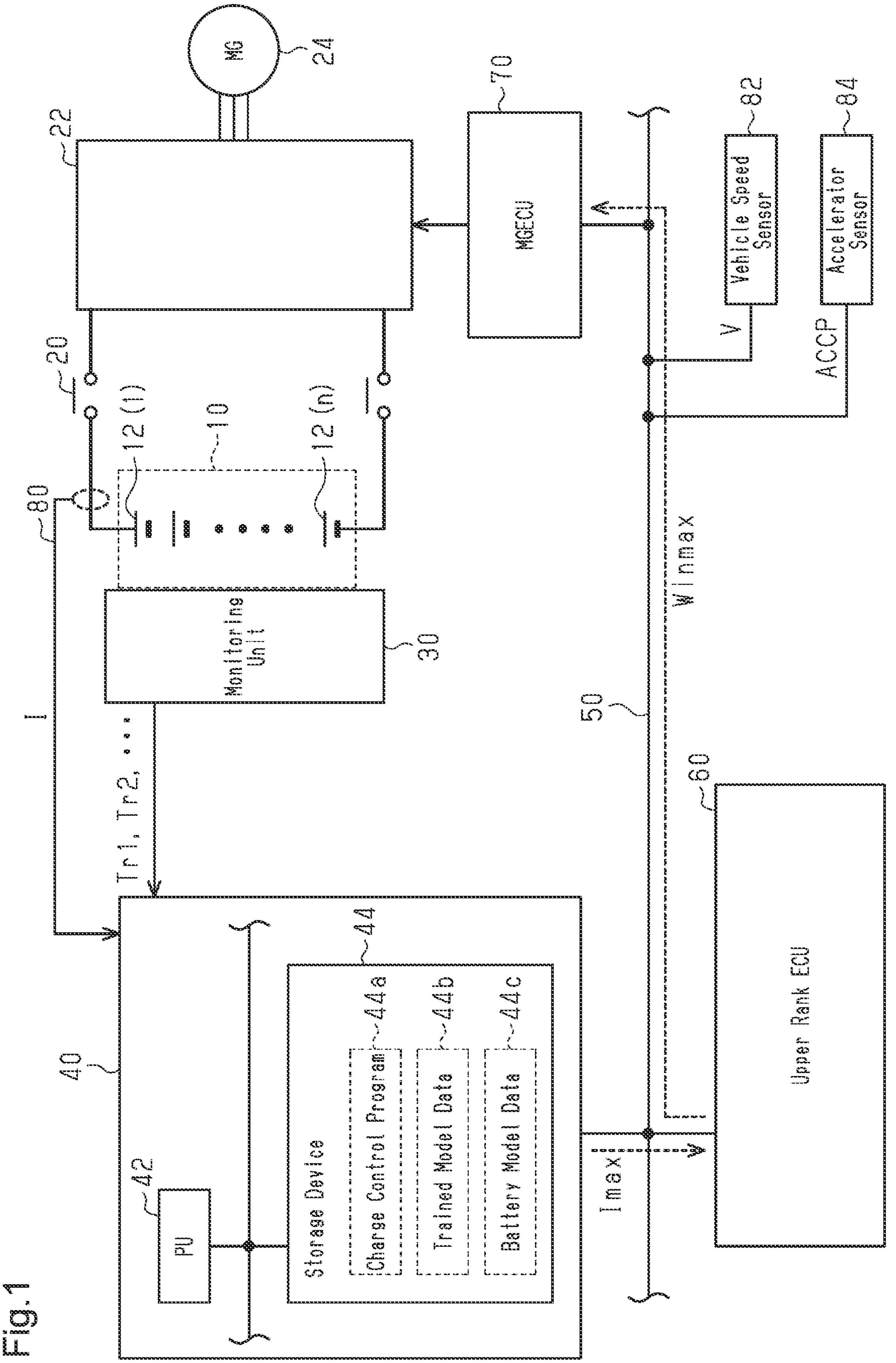
FIG. 1 is a block diagram illustrating a vehicle drive system according to a first embodiment.

FIG. 1 illustrates the configuration of a vehicle drive system.

In a vehicle battery 10, battery cells 12 (1), 12 (2), . . . 12 (*n*) are connected in series. The terminal voltage of the vehicle battery 10 may be, for example, several tens of volts to several hundreds of volts. In the battery cells 12 (1), 12 (2), . . . , 12 (*n*), the numbers in parentheses are numbers designated to identify the cells. Hereinafter, the battery cells 12 (1), 12 (2), . . . 12 (*n*) will collectively be referred to as a battery cell 12. The battery cell 12 is a lithium-ion rechargeable battery.

A terminal of the vehicle battery 10 is connected to a power conversion circuit 22 via a system main relay 20. The power conversion circuit 22 supplies electric power from the vehicle battery 10 to a motor generator 24. Further, the power conversion circuit 22 supplies the electric power generated by the motor generator 24 to the vehicle battery 10. The motor generator 24 is mechanically connected to the drive wheels of the vehicle.

A monitoring unit 30 monitors the state of the battery cells 12 (1), 12 (2), . . . 12 (*n*) of the vehicle battery 10.

A battery ECU 40 monitors the state of the vehicle battery 10. The battery ECU 40 is configured to communicate with a upper rank ECU 60 via an in-vehicle network 50. The upper rank ECU 60 manages electric power in the vehicle drive system. The upper rank ECU 60 controls the driving force of the motor generator 24 by outputting a command to a MG ECU 70 via the in-vehicle network 50. The amount of charge-discharge electric power of the vehicle battery 10 is also controlled by controlling the driving force. Therefore, the upper rank ECU 60 outputs a command to the MG ECU 70 via the in-vehicle network 50 to control the amount of charge-discharge electric power of the vehicle battery 10.

The MG ECU 70 controls the motor generator 24. The MG ECU 70 operates the power conversion circuit 22 to control torque or the like that is a control amount of the motor generator 24.

The battery ECU 40 refers to a charge-discharge current I of the vehicle battery 10 detected by a current sensor 80. In addition, the battery ECU 40 refers to representative temperatures Tr1, Tr2, . . . , which are temperatures of certain ones of the battery cells 12 (1), 12 (2), . . . 12 (*n*) detected by the monitoring unit 30. The battery ECU 40 refers to a vehicle speed V detected by a vehicle speed sensor 82. The battery ECU 40 refers to an accelerator operation amount ACCP detected by an accelerator sensor 84. The accelerator operation amount ACCP is a depression amount of an accelerator pedal.

The battery ECU 40 sets a maximum value Imax of a charge current at which lithium will not deposit on the negative electrode of the vehicle battery 10, and outputs the maximum value Imax to the upper rank ECU 60. The upper rank ECU 60 calculates a maximum charging power Winmax, which is the maximum value of the charging power of the vehicle battery 10, based on the maximum value Imax, and outputs the maximum charging power Winmax to the MG ECU 70.

The battery ECU 40 includes a PU 42 and a storage device 44. The PU 42 is a software processing device such as a CPU, a GPU, or a TPU. The storage device 44 may be a storage medium such as an electrically rewritable nonvolatile memory and a disk medium.

Process for Setting Maximum Value Imax

Figure 2:
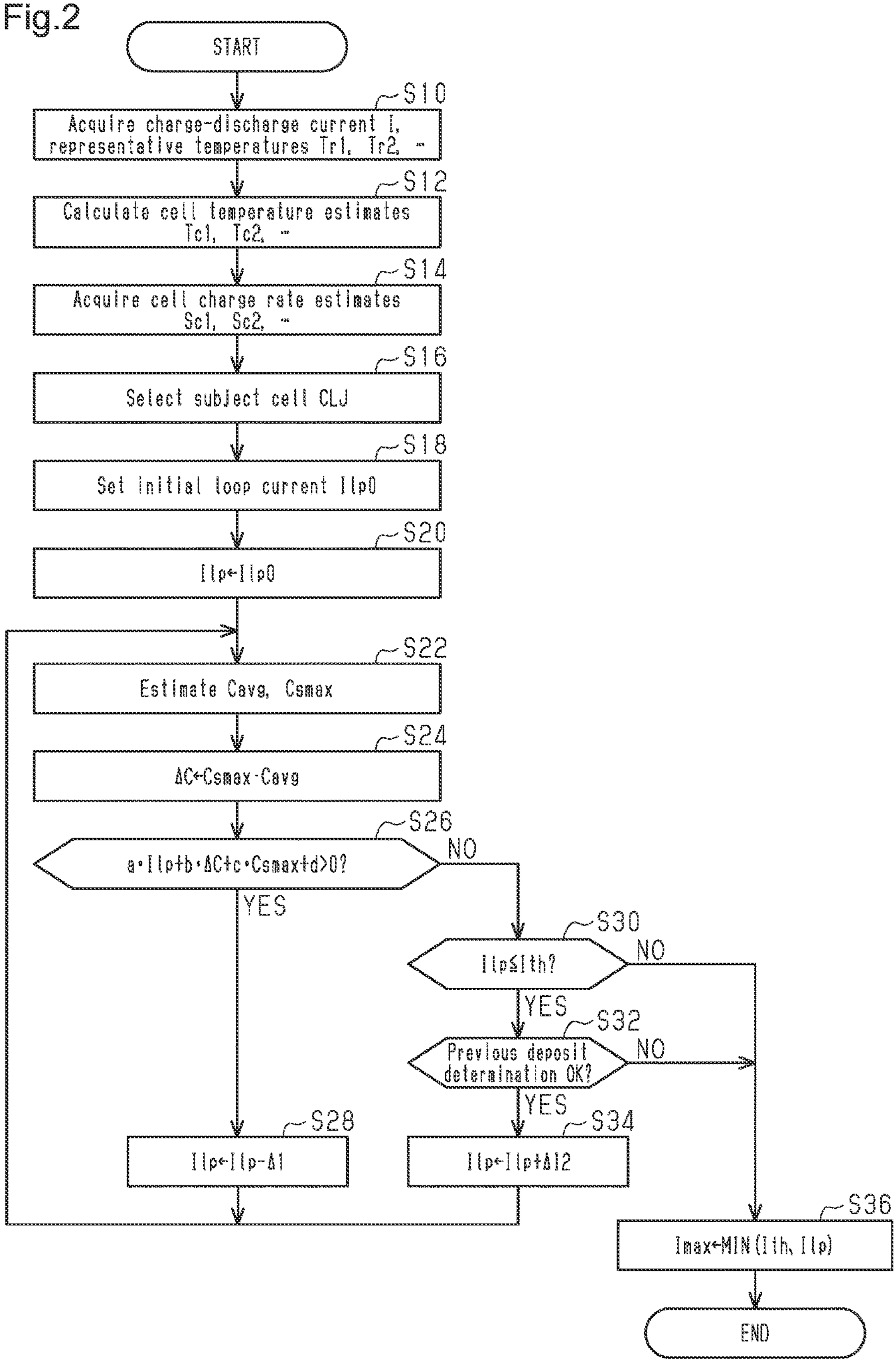
FIG. 2 is a flowchart illustrating a process executed by a battery ECU according to the first embodiment.

FIG. 2 illustrates a process for setting the maximum value Imax. The PU 42 performs the process of FIG. 2 by, for example, repeatedly executing a charge control program 44*a* stored in the storage device 44 in predetermined cycles. Hereinafter, the letter S added to a number indicates a process step.

In the series of steps illustrated in FIG. 2, the PU 42 first acquires the charge-discharge current I and the representative temperatures Tr1, Tr2, . . . (S10). Next, the PU 42 calculates cell temperature estimates Tc1, Tc2, . . . , which are estimates of the temperatures of the battery cells 12 (1), 12 (2), . . . , based on the representative temperatures Tr1, Tr2, . . . (S12). For example, when the representative temperature Tr1 is the temperature of the battery cell 12 (1), the PU 42 substitutes the representative temperature Tr1 for the cell temperature estimate Tc1. For example, when the representative temperatures Tr1, Tr2 are the temperatures of the battery cells 12 (1), 12 (10), the PU 42 substitutes the weighted average value of the representative temperatures Tr1, Tr2 for each of the cell temperature estimates Tc2, Tc3, . . . , Tc9. The PU 42 adjusts the weighting factor of the weighted average process such that the cell temperature estimate Tc2 is set to a value closer to the representative temperature Tr1 than the representative temperature Tr2. In addition, the PU 42 adjusts the weighting factor of the weighted average process such that the cell temperature estimate Tc9 is set to a value closer to the representative temperature Tr2 than the representative temperature Tr1.

Next, the PU 42 acquires cell charge rate estimates Sc1, Sc2, . . . , which are estimates of the charge rates of the battery cells 12 (1), 12 (2), . . . (S14). The cell charge rate estimates Sc1, Sc2, . . . may be values calculated by the PU 42 using, for example, the cell temperature estimates Tc1, Tc2, . . . and the charge-discharge current I as inputs.

Next, the PU 42 selects a subject cell CLj which is the one cell of the battery cells 12 (1), 12 (2), . . . 12 (*n*) where lithium is most likely to be deposited (S16). The PU 42 selects the subject cell CLj based on the cell temperature estimates Tc1, Tc2, . . . and the cell charge rate estimates Sc1, Sc2, . . . . This steps focuses on the following two characteristics. That is, during charging of the battery cell 12, lithium is more likely to be deposited on the negative electrode when the temperature of the battery cell 12 is low than when the temperature is high. In addition, during charging of the battery cell 12, lithium is more likely to be deposited on the negative electrode when the charge rate of the battery cell 12 is large than when the charge rate is small. Therefore, the PU 42 gives points indicating the lithium deposition occurrence tendency to each of the battery cells 12 (1), 12 (2), . . . based on the cell temperature estimates Tc1, Tc2, . . . . In addition, the PU 42 gives points indicating the lithium deposition occurrence tendency to each of the battery cells 12 (1), 12 (2), . . . based on the cell charge rate estimates Sc1, Sc2, . . . . Then, the PU 42 sets the cell in which the total points given to the battery cells 12 (1), 12 (2), . . . is the largest as the subject cell CLj.

Next, the PU 42 sets an initial loop current Ilp0 (S18). The initial loop current Ilp0 is an initial value of the charge-discharge current I that is a candidate for the maximum value Imax when searching for the maximum value Imax of the charge current at which lithium deposition will not occur. From the battery cells 12 that have been set as the subject cell CLj in the past, the PU 42 selects a battery cell 12 that is in a state close to the state of the current subject cell CLj. To perform this step, the cell temperature estimate Tcj and the cell charge rate estimate Scj of the subject cell CLj are stored in the storage device 44 each time the PU 42 performs step S16. Further, the PU 42 substitutes the maximum value Imax, which is calculated for the battery cell that is in a state close to the state of the current subject cell CLj, for the initial loop current Ilp0.

Next, the PU 42 substitutes the initial loop current Ilp0 for the loop current Ilp (S20).

Then, the PU 42 calculates an average concentration Cavg of lithium and a maximum surface concentration Csmax of lithium in the negative electrode active material of the battery cell 12 (*j*) using the charge-discharge current I and the cell temperature estimate Tcj as inputs (S22). The maximum surface concentration Csmax is a maximum value of the surface concentration Cs of lithium in the negative electrode active material at a predetermined time.

Step S22 is performed using battery model data 44*c* stored in the storage device 44, which is illustrated in FIG. 1. The battery model data 44*c* forms a battery model M10 approximating a diffusion equation of lithium in the negative electrode active material of the battery cell 12.

Battery Model

Figure 3:
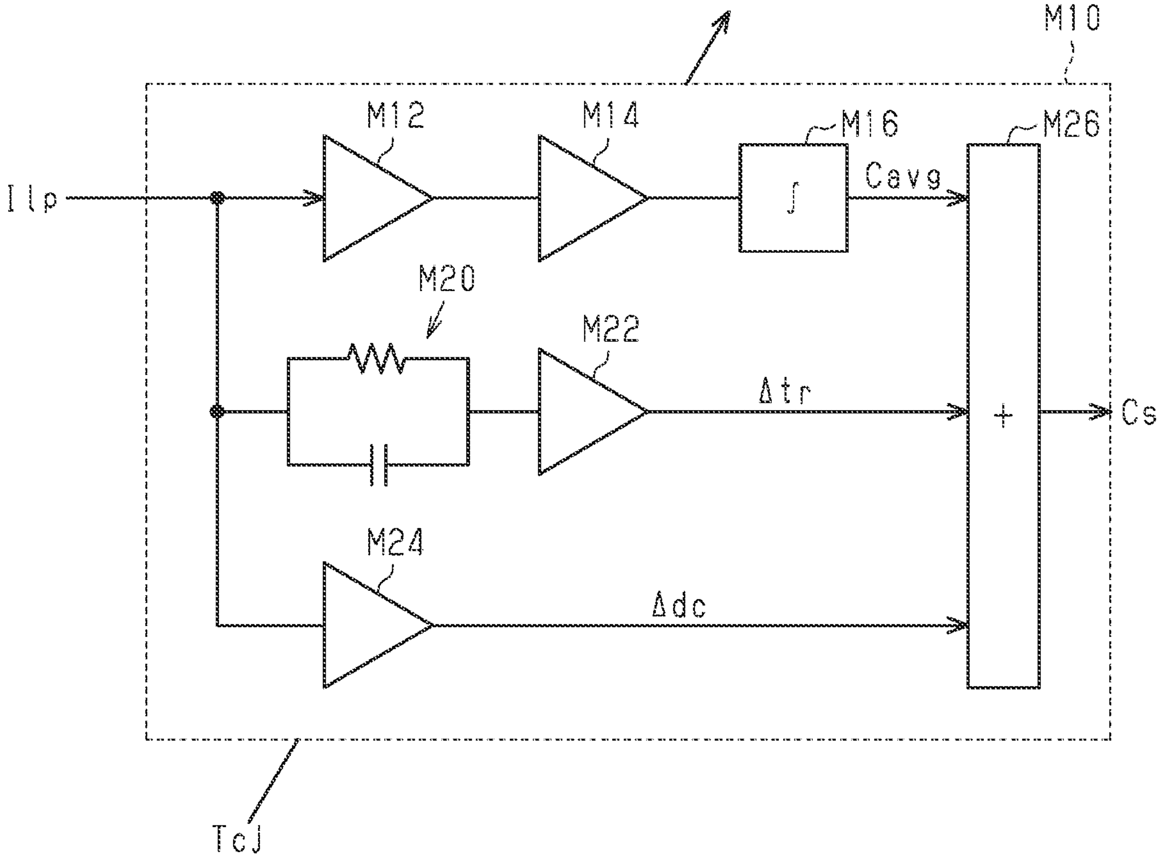
FIG. 3 is a block diagram illustrating a battery model according to the first embodiment.

FIG. 3 illustrates the battery model M10.

A flow rate conversion process M12 outputs the flow rate of lithium ions to the negative electrode active material using the loop current Ilp as an input. The cell temperature estimate Tcj is also input to the flow rate conversion process M12. Therefore, even if the loop current Ilp is the same, the flow rate obtained in the flow rate conversion process M12 will vary in accordance with the cell temperature estimate Tcj.

A concentration conversion process M14 outputs the concentration of lithium entering the negative electrode active material using the flow rate as an input. The cell temperature estimate Tcj is also input to the concentration conversion process M14. Therefore, even if the flow rate is the same, the concentration obtained in the concentration conversion process M14 will vary in accordance with the cell temperature estimate Tcj.

An integration process M16 is a process, using the concentration as an input, for outputting the average concentration Cavg, which is an average value of the lithium concentration in the negative electrode active material.

The transient characteristic model M20 outputs a transient change amount of the lithium concentration in the negative electrode active material using the loop current Ilp as an input. The transient characteristic model M20 is formed using an RC parallel circuit. The cell temperature estimate Tcj is also input to the transient characteristic model M20. Therefore, even if the loop current Ilp is the same, the transient change amount obtained in the transient characteristic model M20 will vary in accordance with the cell temperature estimate Tcj A transient correction amount calculation process M22 outputs a transient correction amount Δtr using the output of the transient characteristic model M20 as an input. The transient correction amount Δtr is a transient component of a difference of the lithium concentration at the surface of the negative electrode active material from the average concentration Cavg. The cell temperature estimate Tcj is also input to the transient correction amount calculation process M22. Therefore, even if the output of the transient characteristic model M20 is the same, the transient correction amount Δtr obtained in the transient correction amount calculation process M22 will vary in accordance with the cell temperature estimate Tcj.

A steady-state correction amount calculation process M24 is a process of outputting a steady-state correction amount Δdc using the loop current Ilp as an input. The steady-state correction amount Δdc is a steady-state component of the difference between the lithium concentration at the surface of the negative electrode active material and the average concentration Cavg. The cell temperature estimate Tcj is also input to the steady-state correction amount calculation process M24. Therefore, even if the loop current Ilp is the same, the steady-state correction amount Δdc obtained in the steady-state correction amount calculation process M24 will vary in accordance with the cell temperature estimate Tcj.

An addition process M26 substitutes a value obtained by adding the transient correction amount Δtr and the steady-state correction amount Δdc to the average concentration Cavg for the surface concentration Cs. The surface concentration Cs is the lithium concentration at the surface of the negative electrode active material.

The battery model M10 uses the cell temperature estimate Tcj as an input because the diffusion coefficient of the above-described diffusion equation is dependent on the temperature of the battery cell 12.

In step S22, the PU 42 sequentially calculates the surface concentration Cs assuming that the charge current of the battery cell 12 (*j*) is constantly fixed to the loop current Ilp over a predetermined time. Then, the PU 42 substitutes the maximum one of the surface concentrations Cs obtained over the predetermined time for the maximum surface concentration Csmax.

Returning to FIG. 2, the PU 42 substitutes the value obtained by subtracting the average concentration Cavg from the maximum surface concentration Csmax for a difference ΔC (S24). This step acquires the difference ΔC as an input variable of a trained model for determining whether lithium deposition will occur. Next, the PU 42 determines whether lithium deposition will occur using the trained model defined by trained model data 44*b* stored in the storage device 44 illustrated in FIG. 1 (S26).

Trained Model

The trained model is an identification model. In particular, the trained model is an equation defining a plane that separates a region where a point specified by the input variable is located into two regions in accordance with whether or not lithium deposition will occur.

More specifically, as illustrated in FIG. 2, a plane defined by model parameters a, b, c, and d separates a region where the following formula is positive from the region where the following formula is negative by inputting the charge-discharge current I, the difference ΔC, and the surface concentration Cs as input variables.

$$a \cdot I + b \cdot \Delta C + c \cdot Csmax + d$$

Figure 4:
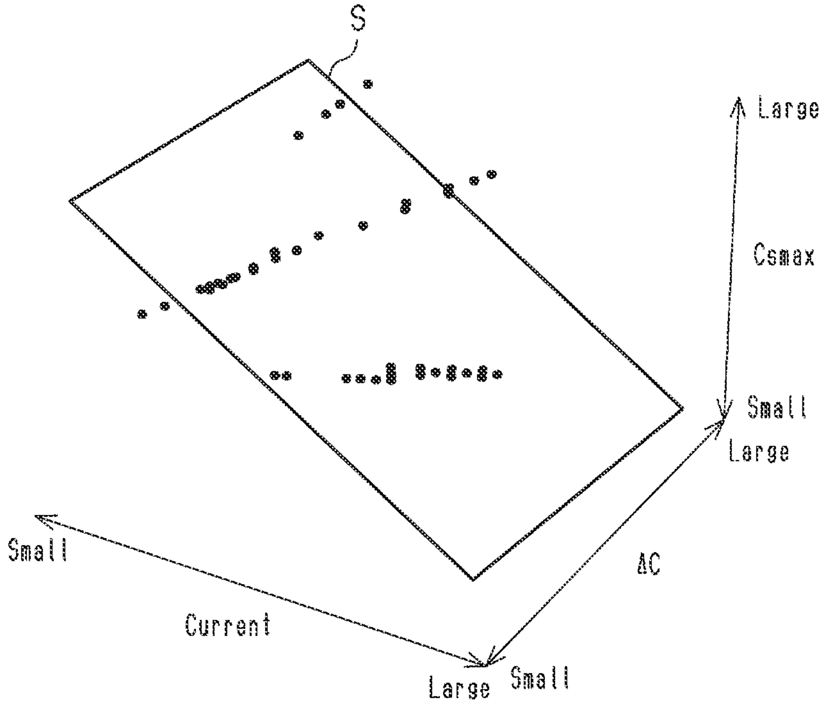
FIG. 4 is a diagram illustrating determination of lithium deposition according to the first embodiment.

FIG. 4 illustrates a plane S defined by the model parameters a, b, c, and d.

When the above formula is positive, the PU 42 determines that lithium deposition will occur. When the above formula is negative, the PU 42 determines that lithium deposition will not occur.

The model parameters a, b, c, and d may be learned using, for example, a support vector machine or the like.

Specifically, the trained model data 44*b* is data learned using training data obtained by keeping the charge-discharge current I constant over a predetermined time. More specifically, the difference ΔC and the maximum surface concentration Csmax are repeatedly calculated by keeping the charge-discharge current I constant over a predetermined time. After the predetermined time elapses, the battery cell 12 is disassembled to visually check for lithium deposition and generate a target label variable. A set of the charge-discharge current I, the difference ΔC, the maximum surface concentration Csmax, and the label variable thus obtained is training data.

Returning to FIG. 2, when determining that lithium deposition will occur (S26: YES), the PU 42 corrects and decreases the loop current Ilp (S28). That is, the PU 42 substitutes a value obtained by subtracting a predetermined amount Δ1 from the loop current Ilp for the loop current Ilp.

When determining that lithium deposition will not occur (S26: NO), the PU 42 determines whether the loop current Ilp is less than or equal to a system threshold value Ith (S30). The system threshold value Ith is the maximum tolerable current of the drive system illustrated in FIG. 1. The system threshold value Ith is set based on, for example, the thermal rating of the power conversion circuit 22.

When determining that the value is less than or equal to the system threshold value Ith (S30: YES), the PU 42 determines whether it was determined in step S26 of the preceding cycle that lithium deposition will not occur (S32). When determining that it was determined in step S26 of the preceding cycle that lithium deposition will not occur (S32: YES), the PU 42 proceeds to step S34. The PU 42 also proceeds to step S34 if step S32 is performed when step S26 is performed for the first time. In step S34, the PU 42 increases and corrects the loop current Ilp. That is, the PU 42 substitutes a value obtained by adding a predetermined amount ΔI2 to the loop current Ilp for the loop current Ilp.

When completing steps S28 and S34, the PU 42 returns to step S22.

When a negative determination is given in step S30 and when a negative determination is given in step S32, the PU 42 substitutes the smaller one of the system threshold value Ith and the loop current Ilp for the maximum value Imax (S36).

When completing step S36, the PU 42 ends the series of steps illustrated in FIG. 2.

Functions and Effects of First Embodiment

The PU 42 calculates the average concentration Cavg and the surface concentration Cs if the charge current is the loop current Ilp over a predetermined time. Then, the PU 42 calculates the maximum surface concentration Csmax, which is the maximum value of the surface concentration Cs over the predetermined time. The PU 42 calculates the difference ΔC between the maximum surface concentration Csmax and the average concentration Cavg. Then, the PU 42 determines whether lithium deposition will occur using the identification model in which the difference ΔC is an input.

Figure 5:
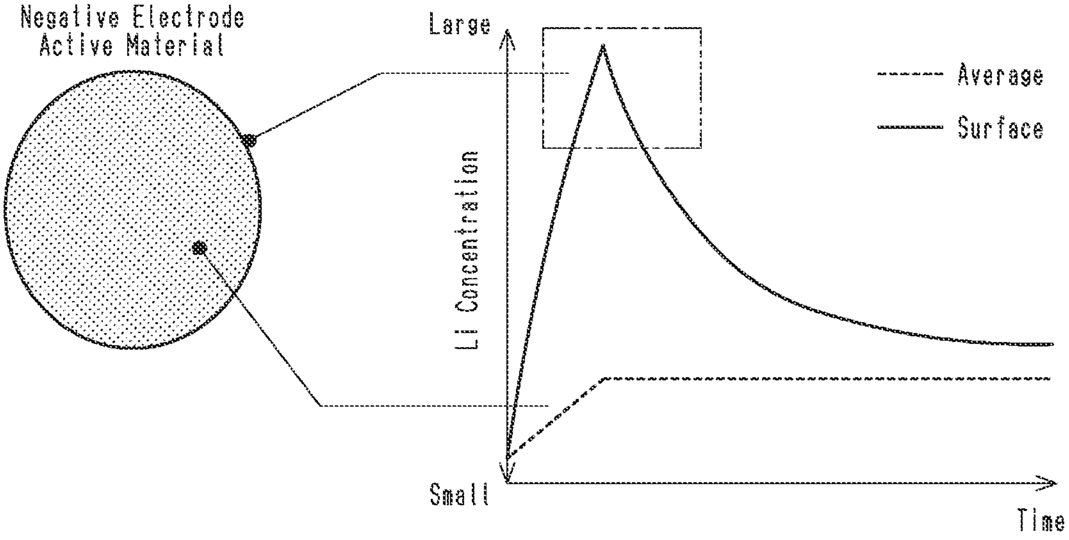
FIG. 5 is a diagram illustrating the principle of deposition determination according to the first embodiment.

FIG. 5 illustrates the transition of the average concentration Cavg and the surface concentration Cs of lithium when a large charge current is applied for a certain period of time. Specifically, in FIG. 5, the transition of the average concentration Cavg is indicated by a broken line. In FIG. 5, the transition of the surface concentration Cs is indicated by a solid line. As indicated by a region surrounded by a two-dot chain line in FIG. 5, when a large charge current flows, the surface concentration Cs temporarily becomes very large. Therefore, the difference between the average concentration Cavg and the surface concentration Cs temporarily becomes very large. The inventor has found that the occurrence of lithium deposition depends on how large the difference is even if conditions such as the charge current are the same.

Therefore, the occurrence of lithium deposition can be accurately determined with the identification model using the difference ΔC as an input variable.

In addition, the PU 42 determines whether lithium deposition will occur from the difference ΔC and the maximum surface concentration Csmax when varying the loop current Ilp. Then, the PU 42 accurately finds the current at which lithium will be deposited and the current at which lithium will not be deposited with high accuracy. As a result, the maximum value Imax can be specified. This allows the maximum value Imax and the maximum charging power Winmax to be as large as possible. Therefore, the electric power generated by the motor generator 24 can be increased as much as possible during deceleration of the vehicle or the like.

Second Embodiment

Hereinafter, a second embodiment will be described with reference to the drawings, focusing on differences from the first embodiment.

In the second embodiment, the trained model is changed.

Figure 6:
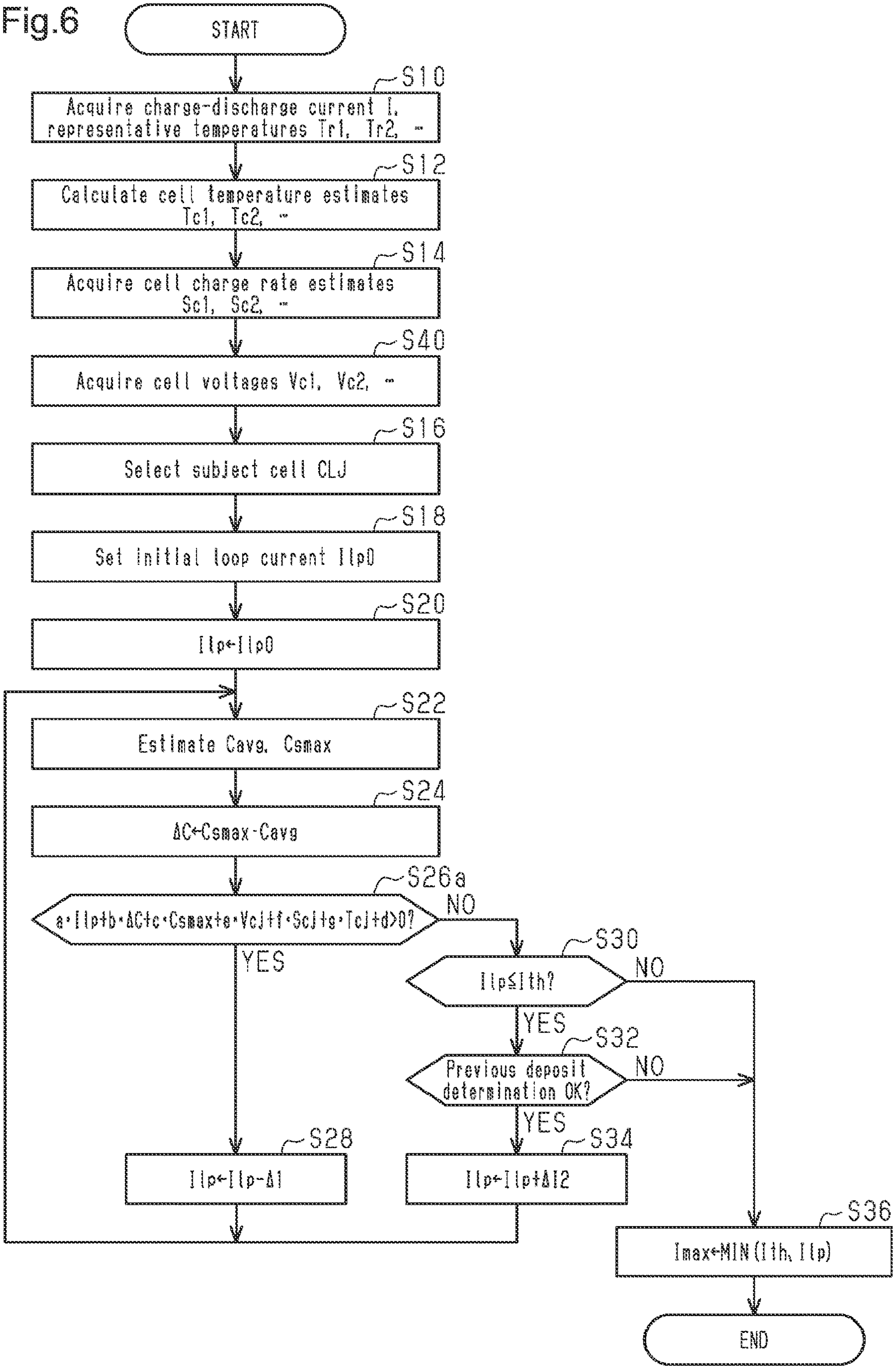
FIG. 6 is a flowchart illustrating a process executed by a battery ECU according to a second embodiment.

FIG. 6 illustrates a process for setting the maximum value Imax. The PU 42 performs the process of FIG. 6 by, for example, repeatedly executing a charge control program 44*a* stored in the storage device 44 in predetermined cycles. In FIG. 6, same numbers are given to those steps that are the same as the corresponding steps illustrated in FIG. 2. Such steps will not be described in detail.

In the steps illustrated in FIG. 6, in addition to steps S10 to S14, the PU 42 acquires the cell voltages Vc1, Vc2, . . . , which are the voltages of the battery cells 12 (1), 12 (2), . . . (S40). For example, if the monitoring unit 30 has a function for detecting the voltages of the battery cells 12 (1), 12 (2), . . . , the detected voltages are the cell voltages Vc1, Vc2, . . . . Further, for example, the cell voltages Vc1, Vc2, . . . may be values estimated by the PU 42 using the battery model M10 illustrated in FIG. 3.

Then, the PU 42 determines whether lithium is deposited by inputting the loop current Ilp, the difference ΔC, the maximum surface concentration Csmax, the cell voltage Vcj, the cell charge rate estimate Scj, and the cell temperature estimate Tcj to the trained model (S26*a*). As illustrated in FIG. 6, the trained model includes model parameters a to g. The PU 42 determines that lithium deposition is occurring when the following formula is positive. When the following formula is negative, the PU 42 determines that lithium deposition is not occurring.

$$a\cdot Ilp+b\cdot \Delta C+c\cdot Csmax+e\cdot Vcj+f\cdot Scj+g\cdot Tcj+d$$

The training data of the trained model is a data set obtained by adding the cell voltage Vcj, the cell charge rate estimate Scj, and the cell temperature estimate Tcj to the charge-discharge current I, the difference ΔC, the maximum surface concentration Csmax, and the label variable described above. The cell voltage Vcj, the cell charge rate estimate Scj, and the cell temperature estimate Tcj may be single sampling values obtained during a predetermined time. However, this is not a limitation. The cell voltage Vcj, the cell charge rate estimate Scj, and the cell temperature estimate Tcj may be average values over a predetermined time.

When making an affirmative determination in step S26*a*, the PU 42 proceeds to step S28. When making a negative determination in step S26*a*, the PU 42 proceeds to step S30.

Third Embodiment

Hereinafter, a third embodiment will be described with reference to the drawings, focusing on differences from the first embodiment.

In the third embodiment, the trained model is changed.

Figure 7:
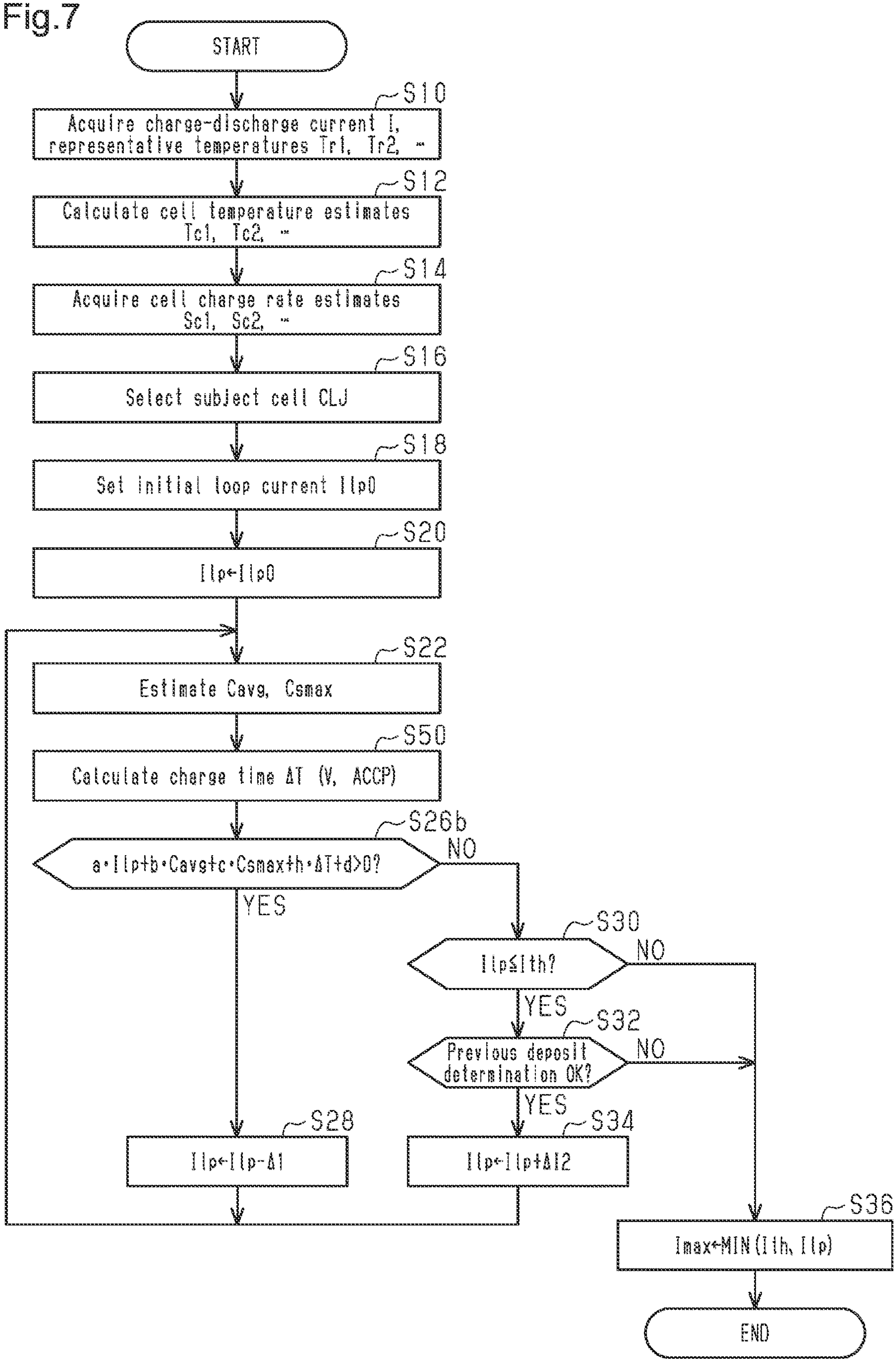
FIG. 7 is a flowchart illustrating a procedure of a process executed by a battery ECU according to a third embodiment.

FIG. 7 illustrates a process for setting the maximum value Imax. The PU 42 performs the process of FIG. 7 by, for example, repeatedly executing a charge control program 44*a* stored in the storage device 44 in predetermined cycles. In FIG. 7, same numbers are given to those steps that are the same as the corresponding steps illustrated in FIG. 2. Such steps will not be described in detail.

In the process illustrated in FIG. 7, in addition to step S22, the PU 42 sets a charge time ΔT which is the duration time of the charging process performed on the subject of lithium deposition determination (S50). The PU 42 sets the charge time ΔT to a time at which the charging of the vehicle battery 10 is expected to continue in accordance with the driving state of the vehicle. Specifically, the PU 42 sets the charge time ΔT using the vehicle speed V and the accelerator operation amount ACCP as inputs. In a state where the accelerator operation amount ACCP is less than or equal to a predetermined value, the PU 42 variably sets the charge time ΔT according to the vehicle speed V such that the charge time ΔT when the vehicle speed V is large becomes larger than or equal to the charge time ΔT when the vehicle speed V is small.

In step S50, the PU 42 may map-calculate the charge time ΔT in a state where the map data is stored in the storage device 44. In the map data, the accelerator operation amount ACCP and the vehicle speed V are input variables, and the charge time ΔT is an output variable.

The map data is a data set of a discrete value of the input variable and a value of the output variable corresponding to each of the values of the input variable. Further, in the map calculation, when the value of the input variable matches any of the values of the input variables of the map data, the value of the output variable of the corresponding map data may be used as the calculation result. In the map calculation, when the value of the input variable does not match any of the values of the input variables of the map data, a value obtained by interpolating the values of the plurality of output variables included in the map data may be used as the calculation result. Alternatively, in the map calculation, when the value of the input variable does not match any of the values of the input variables of the map data, the value of the output variable of the map data corresponding to the closest value among the values of the plurality of input variables included in the map data may be used as the calculation result.

Then, the PU 42 determines whether lithium deposition is occurring by inputting the loop current Ilp, the average concentration Cavg, the maximum surface concentration Csmax, and the charge time ΔT to the trained model (S26*b*). As illustrated in FIG. 7, the trained model includes model parameters a to d and h. The PU 42 determines that lithium deposition is occurring when the following formula is positive. When the following formula is negative, the PU 42 determines that lithium deposition is not occurring.

$$a \cdot Ilp + b \cdot Cavg + c \cdot Csmax + h \cdot \Delta T + d$$

The training data of the trained model is a data set obtained by adding the average concentration Cavg and the charge time ΔT to the charge-discharge current I, the maximum surface concentration Csmax, and the label variable described above.

When making an affirmative determination in step S26*b*, the PU 42 proceeds to step S28. When making a negative determination in step S26*b*, the PU 42 proceeds to step S30.

The input variable of the trained model does not include the difference ΔC. However, the input variable of the trained model includes the average concentration Cavg and the maximum surface concentration Csmax. The set of two variables of the average concentration Cavg and the maximum surface concentration Csmax include information on the difference between the maximum surface concentration Csmax and the average concentration Cavg. Therefore, the set of two variables corresponds to a difference variable indicating information on the difference between the maximum surface concentration Csmax and the average concentration Cavg.

In addition, the trained model includes the charge time ΔT. Therefore, in step S26*b*, the PU 42 determines whether lithium deposition is occurring when charging with the charge current of the loop current Ilp continues for the charge time ΔT. The charge time ΔT changes is accordance with the driving state of the vehicle. Therefore, in a case where the charge time ΔT is not used as an input variable, a trained model will have to be generated over a somewhat long charge time. When using a trained model generated for a long charge time, the occurrence of lithium deposition will be determined even though the charge time is too short for lithium to deposit. In other words, a large margin is provided for determination of lithium deposition. The inclusion of the charge time ΔT in the input variable of the trained model allows for accurate determination of lithium deposition when the vehicle is traveling. Thus, the maximum value Imax will not be set to a value that is smaller than necessary.

Corresponding Relationship

The correspondence relationship between the items described in the above embodiments and the items described in the section of "SUMMARY" will now be described. Hereinafter, each numbered example corresponds to the example with the same number in the section of "SUMMARY."

Example 1) The storage device corresponds to the storage device 44. The execution device corresponds to the PU 42. The deposition determination mapping data corresponds to the trained model data 44*b*. The difference variable corresponds to the difference ΔC in FIGS. 2 and 6 and the set of the average concentration Cavg and the maximum surface concentration Csmax in FIG. 7. The determination acquisition process corresponds to steps S20 to S24 in FIG. 2, steps S12, S14, S20 to S24, and S40 in FIG. 6, and steps S20, S22, and S50 in FIG. 7. The determination process corresponds to steps S26, S26*a*, and S26*b*.

Example 2) The inputs of the loop current Ilp, the cell voltage Vcj, the cell charge rate estimate Scj, and the cell temperature estimate Tcj in step S26*b*.

Example 3) The charge time setting process corresponds to step S50. The charge time variable corresponds to the charge time ΔT.

Examples 4 and 5) The difference variable output mapping data corresponds to the battery model data 44*c*. The acquisition process for difference variable calculation corresponds to steps S12, S20, S28, and S34. The difference variable calculation process corresponds to steps S22 and S24 in FIGS. 2 and 6 and step S22 in FIG. 7. The difference variable corresponds to the difference ΔC in FIGS. 2 and 6 and the set of the average concentration Cavg and the maximum surface concentration Csmax in FIG. 7. The difference variable output mapping corresponds to the mapping in steps S22 and S24 in FIGS. 2 and 6 and the mapping in step S22 of FIG. 7.

Example 6) The average concentration output mapping corresponds to the flow rate conversion process M12, the concentration conversion process M14, and the integration process M16. The surface concentration output mapping corresponds to the flow rate conversion process M12, the concentration conversion process M14, the integration process M16, the transient characteristic model M20, the transient correction amount calculation process M22, the steady-state correction amount calculation process M24, and the addition process M26.

Example 7) The search process corresponds to steps S28 and S30 to S34. The upper limit value setting process corresponds to step S36.

Example 8) The initial value setting process corresponds to step S18.

Example 9) The selection process corresponds to step S16.

OTHER EMBODIMENTS

The present embodiment may be modified as described below. The present embodiment and the modified examples described below may be implemented in combination as long as there is technically consistency.

Input Variable of Deposition Determination Mapping

The input variable of the deposition determination mapping is not limited to the variables illustrated in FIGS. 2, 6, and 7. For example, in step S26, the charge time ΔT may be included in the input variable. Further, for example, in step S26*a*, the charge time ΔT may be included in the input variable. Further, for example, in step S26, the loop current Ilp may be deleted from the input variable. Furthermore, for example, in step S26, the maximum surface concentration Csmax may be deleted from the input variable. Furthermore, for example, in step S26*a*, one, two, or three of the four variables of the loop current Ilp, the cell temperature estimate Tcj, the cell voltage Vcj, and the cell charge rate estimate Scj may be deleted from the input variable. Furthermore, for example, in step S26*b*, at least one of the cell temperature estimate Tcj, the cell voltage Vcj, and the cell charge rate estimate Scj may be included in the input variable. Further, for example, in step S26*b*, the loop current Ilp may be deleted from the input variable.

As long as the temperatures of the battery cells 12 (1), 12 (2), . . . , 12 (*n*) can be detected, the detection values of the temperatures of the battery cells 12 (1), 12 (2), . . . may be used instead of the cell temperature estimates Tcj (1), Tcj (2), . . . .

The difference ΔC is not limited to a value obtained by subtracting the average concentration Cavg from the maximum surface concentration Csmax, which is the maximum value of the surface concentration Cs in the predetermined period (charge time ΔT). For example, instead of the maximum surface concentration Csmax, the surface concentration Cs at the time when charging of the loop current Ilp is continued for a predetermined time may be used. The predetermined time may be variably set in accordance with the traveling state of the vehicle.

As the input variable of the deposition determination mapping, instead of using the maximum surface concentration Csmax, the surface concentration Cs at the time when the charging of the loop current Ilp is continued for a predetermined time may be used. The predetermined time may be variably set in accordance with the traveling state of the vehicle.

Deposition Determination Mapping Data

The deposition determination mapping data is not limited to data related to the model parameters a, b, . . . . For example, the deposition determination mapping data may be data related to the support vector obtained in the learning process. In other words, the deposition mapping data is not limited to data related to the parametric model, and may be data related to a non-parametric model.

The deposition determination mapping data does not have to be related to the trained model. For example, the deposition determination mapping data may be map data in which a difference variable indicating a difference between the average concentration Cavg and the maximum surface concentration Csmax is included in the input variable and a binary value indicating whether lithium deposition is used as the output variable. In such a case, the deposition determination mapping is a mapping formed by map data without using the trained model.

Deposition Determination Mapping

The trained model forming the deposition determination mapping does not have to be formed by a support vector machine. Such a trained model may be, for example, a discriminant function having a dependent variable of a logistic sigmoid function as an output variable. In that case, the occurrence of lithium deposition may be determined in accordance with whether the value of the output variable of the logistic sigmoid function is larger than or equal to the threshold value. The input variable of the logistic sigmoid function may be a linear mapping having the input variable of the deposition determination mapping as an input. Furthermore, for example, the input variable of the logistic sigmoid function may be a neural network having the input variable of the deposition determination mapping as an input. In other words, the trained model may be a neural network in which the output activity function is a logistic sigmoid function. However, it is not essential that the output variable of the trained model that outputs the probability of whether lithium is deposited is the output variable of the logistic sigmoid function. For example, an output variable of a softmax function having two outputs of a probability that lithium is deposited and a probability that lithium is not deposited may be an output variable of a trained model that outputs the probability of whether lithium is deposited.

Average Concentration

The average concentration Cavg does not have to be calculated from a model formula such as the battery model data 44*c*. For example, a value obtained by multiplying the cell charge rate estimate Scj by a predetermined coefficient may be set as the average concentration Cavg.

Difference Variable Output Mapping

The difference variable output mapping does not have to be formed with the battery model illustrated in FIG. 3. For example, the model in Japanese Laid-Open Patent Publication No. 2019-114475 may be used as the battery model.

The input variable of the surface concentration output mapping does not have to be the same as the input variable of the average concentration output mapping.

The difference variable output mapping does not have to include the surface concentration output mapping and the average concentration output mapping. The difference variable output mapping may form, for example, a mapping that directly outputs the difference ΔC using the input variable of the difference variable output mapping as an input.

Search Process

FIGS. 2, 6, and 7 each illustrate a process for searching for the maximum value of the charge current at which lithium will not deposit using the subject cell CLj. However, this is not a limitation. For example, a process for searching for the maximum value of the charge current at which lithium will not deposit may be performed on each of the battery cells 12 (1) to 12 (*n*). In this case, the minimum value of the maximum values of the battery cells 12 (1) to 12 (*n*) may be set as the final search result of the maximum value of the charge current at which lithium will not deposit. In other words, the selection process does not have to be included in the search process.

The search process does not have to include step S18. In other words, the initial value setting process does not necessarily have to be performed.

Upper Limit Value Setting Process

The upper limit value setting process does not have to set the maximum value Imax. The upper limit value setting process may set, for example, the maximum charging power Winmax.

Use of Determination Result of Lithium Deposition

The determination result of whether lithium deposition is occurring does not have to be used to set a small upper limit vale for limiting the maximum value of charge power. For example, the determination result may be used to predict the life of the lithium-ion rechargeable battery.

State Determination Device

In FIG. 1, the battery ECU 40 forms the state determination device. This, however, is not a limitation. For example, the state determination device may be formed by a device integrating the battery ECU 40 and the upper rank ECU 60.

Execution Device

The execution device is not limited to a device that executes a software process. The execution device may include, for example, a dedicated hardware circuit such as an ASIC that executes at least some of the processes executed in the above embodiments. That is, the execution device may include a processing circuit having any of following structures (a) to (c). (a) A processing circuit including a processing device that executes all of the above processes according to a program. (b) A processing circuit including a processing device that executes some of the above processes based on a program; and a dedicated hardware circuit that executes the remaining processes. (c) A processing circuit including a dedicated hardware circuit that performs all of the above processes. There may be more than one software execution device that includes the processing device and a program storage device. Furthermore, there may be more than one dedicated hardware circuit.

Lithium-Ion Rechargeable Battery

The lithium-ion rechargeable battery does not have to be a battery pack. The lithium-ion rechargeable battery is not limited to a vehicle battery.

Others

The maximum charging power Winmax does not have to be output from the upper rank ECU 60 to the MG ECU 70. For example, the upper rank ECU 60 does not have to output the maximum charging power Winmax and may calculate a command value output to the MG ECU 70 in accordance with to the maximum charging power Winmax.

Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

What is claimed is:

1. A state determination device for a lithium-ion rechargeable battery, comprising:

a storage device; and an execution device, wherein the storage device stores deposition determination mapping data, the deposition determination mapping data is data for defining a deposition determination mapping;

the deposition determination mapping is mapping that uses a difference variable as an input variable and outputs information on whether lithium is deposited on a negative electrode of the lithium-ion rechargeable battery;

the difference variable is a variable indicating information on a difference between a surface concentration of the negative electrode active material and an average concentration of the negative electrode active material in the lithium-ion rechargeable battery;

the execution device is configured to execute a determination acquisition process and a determination process;

the determination acquisition process is a process for acquiring a value of the input variable of the deposition determination mapping; and the determination process is a process for determining deposition of lithium by inputting the value of the input variable of the deposition determination mapping to the deposition determination mapping.

2. The state determination device according to claim 1, wherein the input variable of the deposition determination mapping includes at least one of a current of the lithium-ion rechargeable battery, a voltage of the lithium-ion rechargeable battery, a charge rate of the lithium-ion rechargeable battery, and a temperature of the lithium-ion rechargeable battery.

3. The state determination device according to claim 1, wherein:

the lithium-ion rechargeable battery is a rechargeable battery charged by electric power generated by a motor generator of a vehicle;

the execution device is configured to execute a charge time setting process, the charge time setting process is a process for setting a value of a charge time variable in accordance with a traveling state of the vehicle;

the charge time variable is a variable indicating a charge time of the lithium-ion rechargeable battery; and the input variable of the deposition determination mapping includes the charge time variable.

4. The state determination device according to claim 1, wherein:

the storage device stores difference variable output mapping data;

the difference variable output mapping data is data for defining a difference variable output mapping;

the difference variable output mapping is mapping using a current of the lithium-ion rechargeable battery as an input variable to output a value of the difference variable;

the execution device is configured to execute a difference variable calculation acquisition process and a difference variable calculation process;

the acquisition process for difference variable calculation is a process for acquiring the value of the input variable of the difference variable output mapping; and the difference variable calculation process is a process for calculating the value of the difference variable by inputting the value of the input variable of the difference variable output mapping to the difference variable output mapping.

5. The state determination device according to claim 4, wherein the input variable of the difference variable output mapping includes temperature of the lithium-ion rechargeable battery.

6. The state determination device according to claim 4, wherein:

the input variable of the deposition determination mapping includes the surface concentration;

the difference variable output mapping includes an average concentration output mapping and a surface concentration output mapping;

the input variable of the difference variable output mapping includes an input variable of the average concentration output mapping and an input variable of the surface concentration output mapping;

the average concentration output mapping is mapping using a value of the input variable of the average concentration output mapping as an input to output the average concentration;

the surface concentration output mapping is mapping using a value of the input variable of the surface concentration output mapping as an input to output the surface concentration; and the difference variable calculation process includes a process for calculating the average concentration by inputting the value of the input variable of the average concentration output mapping to the average concentration output mapping, and a process of calculating the surface concentration by inputting the value of the input variable of the surface concentration output mapping to the surface concentration output mapping.

7. The state determination device according to claim 1, wherein:

the execution device is configured to execute a search process and an upper limit value setting process;

the determination acquisition process includes a process for acquiring values of a plurality of the difference variables under an assumption that a charge current of the lithium-ion rechargeable battery will take various values;

the search process is a process for searching for a maximum value of the charge current at which deposition of the lithium will not occur based on whether lithium deposition will occur that is determined in the determination process from the values of the plurality of difference variables acquired through the determination acquisition process; and the upper limit value setting process is a process for setting a upper limit value for limiting charging power of the lithium-ion rechargeable battery to a lower side based on a maximum value of the charge current.

8. The state determination device according to claim 7, wherein:

the execution device includes an initial value setting process;

the initial value setting process is a process for setting an initial value related to a candidate for a maximum value of the charge current in accordance with the maximum value searched for by the search process in the past; and the search process includes a process for determining a relative magnitude between the initial value and the charge current that is the candidate for the maximum value in accordance with a determination result of the determination process using the initial value.

9. The state determination device according to claim 1, wherein:

the lithium-ion rechargeable battery is a battery pack of series-connected battery cells;

the execution device is configured to execute a selection process;

the selection process is a process for selecting from the battery cells one having a high probability of lithium deposition occurring based on temperature of each of the battery cells; and the determination process is a process for determining whether lithium deposition is occurring in the battery cell selected by the selection process.

* * * * *